United States Patent
Schafbauer et al.

(10) Patent No.: US 6,815,317 B2
(45) Date of Patent: Nov. 9, 2004

(54) METHOD TO PERFORM DEEP IMPLANTS WITHOUT SCATTERING TO ADJACENT AREAS

(75) Inventors: Thomas Schafbauer, Wappinger Falls, NY (US); Sandrine E. Sportouch, Fishkill, NY (US)

(73) Assignees: International Business Machines Corporation, Armonk, NY (US); Infineon Technologies, AG, Munich (DE)

( * ) Notice: Subject to any disclaimer, the term of this patent is extended or adjusted under 35 U.S.C. 154(b) by 0 days.

(21) Appl. No.: 10/164,243

(22) Filed: Jun. 5, 2002

(65) Prior Publication Data

US 2003/0228741 A1 Dec. 11, 2003

(51) Int. Cl.[7] ............................................... H01L 21/04
(52) U.S. Cl. ...................... 438/510; 438/517; 438/519; 438/527; 438/531; 438/636
(58) Field of Search ................................ 438/510, 517, 438/519, 527, 531, 636, 471, 276, 514

(56) References Cited

U.S. PATENT DOCUMENTS

| | | | | |
|---|---|---|---|---|
| 4,089,103 A | * | 5/1978 | Hendrickson et al. | 438/356 |
| 5,935,867 A | * | 8/1999 | Alvis et al. | 438/302 |
| 6,204,540 B1 | * | 3/2001 | Otsuki | 257/390 |
| 6,610,585 B1 | * | 8/2003 | Brown et al. | 438/510 |
| 6,667,205 B2 | * | 12/2003 | Breitwisch et al. | 438/223 |
| 2002/0160557 A1 | * | 10/2002 | Peake et al. | 438/197 |

* cited by examiner

*Primary Examiner*—W. David Coleman
*Assistant Examiner*—Khiem Nguyen
(74) *Attorney, Agent, or Firm*—Ira D. Blecker

(57) ABSTRACT

A method of fabricating an integrated circuit in and on a semiconductor substrate with deep implantations by applying a scattered ion capturing layer in the resist mask opening to capture any implanted ions scattered in the resist and deflected out of the resist into the mask opening to prevent these ions from reaching the semiconductor substrate and affecting the concentration of ions at the edge of the mask and thus the performance of the integrated circuit.

21 Claims, 4 Drawing Sheets

METHOD TO PERFORM DEEP IMPLANTS WITHOUT SCATTERING TO ADJACENT AREAS

FIELD OF THE INVENTION

The present invention relates to semiconductor integrated circuits and, more particularly, to the fabrication of integrated circuits requiring deep implant of impurities.

BACKGROUND OF THE INVENTION

With increasing levels of integration in semiconductor chips or dies in a wafer, such as those with a silicon substrate, greater demands on the method of fabricating the semiconductor chips, such as making deep implant of impurities into the semiconductor substrate. Deep implantation at higher dosage is required to stop leakage effects and for higher performance and increased density. However, as the layout of the integrated circuit positions the transistors, parts of the transistor and other components of the circuit closer and closer together, it becomes increasing difficult to perform a deep implant step in the fabrication method in one area of the layout with encroaching on an adjacent area and effecting the required parameters of that area. Since the layout of the integrated circuit will continue to shrink, this problem will become even more critical in future generations of integrated circuits.

During deep implantation, the impurities being implanted, which are shown as arrows in FIGS. 2 and 3 representing the prior art, scatter in the implant mask, such as photoresist. The mask is used to protect the other areas of the integrated circuit which are not intended to be implanted with impurities during this implantation step. However, at the edges of the implant mask, as shown in FIG. 3, some of the implanted impurities scatter out of the implant mask and into the unmasked areas of the wafer. This undesirable scattering of impurities into adjacent unmasked areas of the wafer will affect the performance of the fabricated integrated circuit and lower the manufacturing yield of the integrated circuits chips in a wafer.

Thus, with increasing density of integrated circuits, especially integrated circuits requiring deep implants of impurities, it is critical to have a fabrication process which is will overcome this scattering of the impurities into substrate areas adjacent to the implant masked areas. Accordingly, it is an object of the present invention to design a process for fabricating an integrated circuit chip requiring deep implants of impurities which prevents the impurities from scattering into substrate areas adjacent to the implant masked areas. In addition, it is an object of the present invention to provide a simple modification to the prior art method of deep implantation, which will not impact the throughput of the prior art deep implant process and which will not complicate the overall fabrication of the integrated circuit chip. Further, it is object of the present invention to provide a simple modification such that the prior art process steps following the deep implant step will not be substantially affected by the modification.

SUMMARY OF THE INVENTION

To achieve these and other objects, a fabrication process of the present invention for preventing scattering of impurities from masked layer into substrate areas adjacent to the masked area during a deep implant, a thin, easily removable, scattered impurity capturing layer is present in the areas adjacent the implant masked areas to capture the scattered impurities and prevent them from reaching the wafer substrate. Preferably, the layer is an anti-reflecting coating (ARC) which normally is positioned beneath a photoresist and is well known in the art for preventing UV light used in exposing the photoresist from being reflected back from the surface of the wafer. However, in the present invention, the ARC is not used for that purpose and its function is to capture scattered impurities and not prevent reflected UV light. Although other materials can be used, such as a hard mask of a silicate glass, the advantage of the ARC is that it may be present during the exposure of the photoresist and, after selective removal the photoresist, it can remain and serve the new function of the present invention. It also is easily removed when its function of collecting scattered implanted impurities is finished.

Since the scattered implanted impurities contain in the range of one-third ($\frac{1}{3}$) to one-one hundredth ($\frac{1}{100}$) the energy of the original impurities and are scattered at an angle and not normal to the wafer, the thickness of the capturing layer can range in thickness from one-third ($\frac{1}{3}$) to one fiftieth ($\frac{1}{50}$) the depth of the deep implanted impurities.

Although the present invention of using a scattered impurity ion collection layer during deep implantion is highly-suited for forming N-wells and P-wells for a CMOS transistor, it also can be used for any deep implantion, such as highly doped source/drain and pocket/extension implants, collector, base and emitter implants for bipolar devices, barrier implants to separate a well from the substrate, implants for gate doping and implants to connect wells together.

BRIEF DESCRIPTION OF THE DRAWINGS

The invention is best understood from the following detailed description when read in connection with the accompanying drawing. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

Figure 1:
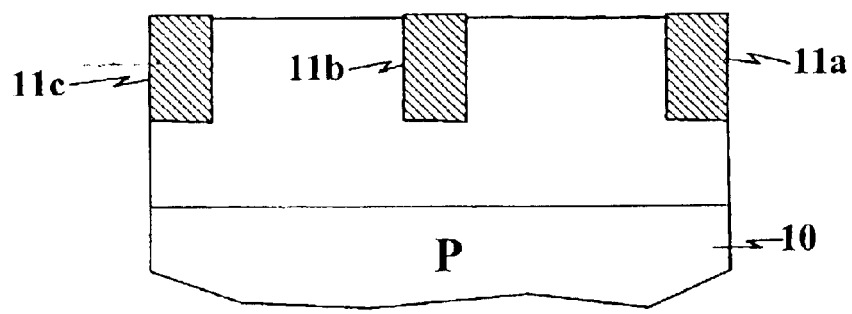
FIG. 1 is a cross-sectional partial view of a prior art semiconductor wafer containing shallow trench isolation of the areas to be made active during fabrication of an integrated circuit.
Figure 2:
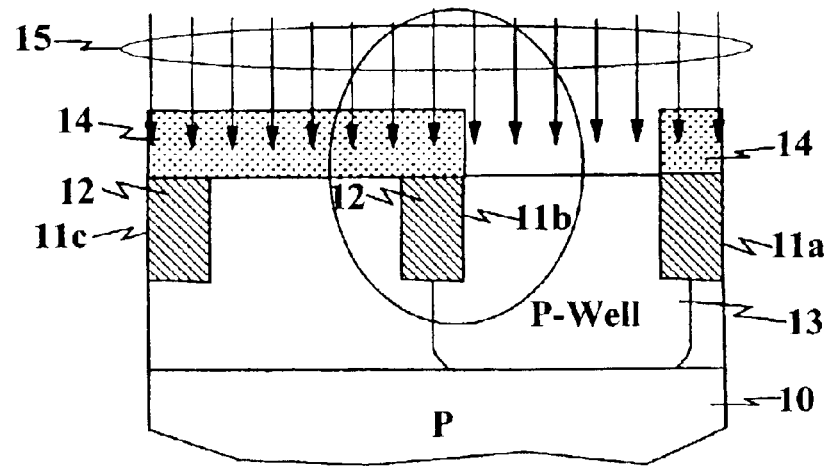
FIG. 2 is cross-sectional view of the prior art semiconductor wafer of the FIG. 1 with part of the wafer masked with a photoresist during deep implantation of impurities to form a P-well.

A detailed description of the present invention will now be made by referring to the accompanying drawings. FIG. 1 shows a partial cross-section of a semiconductor wafer 10, herein silicon, with shallow isolation trenches 11a, 11b, and 11c in the wafer to isolate the active areas to be formed in the wafer during fabrication. The shallow trench isolation (STI) is formed by reactive ion etching openings in the wafer and filling the etched opening (not shown unfilled) with an insulating material 12, such as silicon oxide. To fabricate a CMOS transistor, a P-well and a N-well must formed in the wafer 10 by implanting the appropriate impurity, such as boron for the P-well and phosphorus for the N-well. As shown in FIG. 2, the prior art method of forming a P-well 13 is to deposit a photoresist 14, such as a diazonaphthoquinone type, on the wafer 10 and expose and develop it so that the photoresist masks all but where the P-well 13 is to be formed; herein, between the trenches 11a and 11b. Boron ions, as shown by the arrows 15 in FIG. 2, are implanted into the wafer 10 in the area not masked by the photoresist. In the photoresist masked area, which covers the area between trenches 11b and 11c and the trenches 11a, 11b and 11c, the boron ions as shown by the arrows 15 are blocked by the photoresist 14, except for those scattered ions as shown by the arrows 15a in FIG. 3, some of which are deflected into the unmasked area as shown by holes 16 in FIG. 3.

Figure 4:
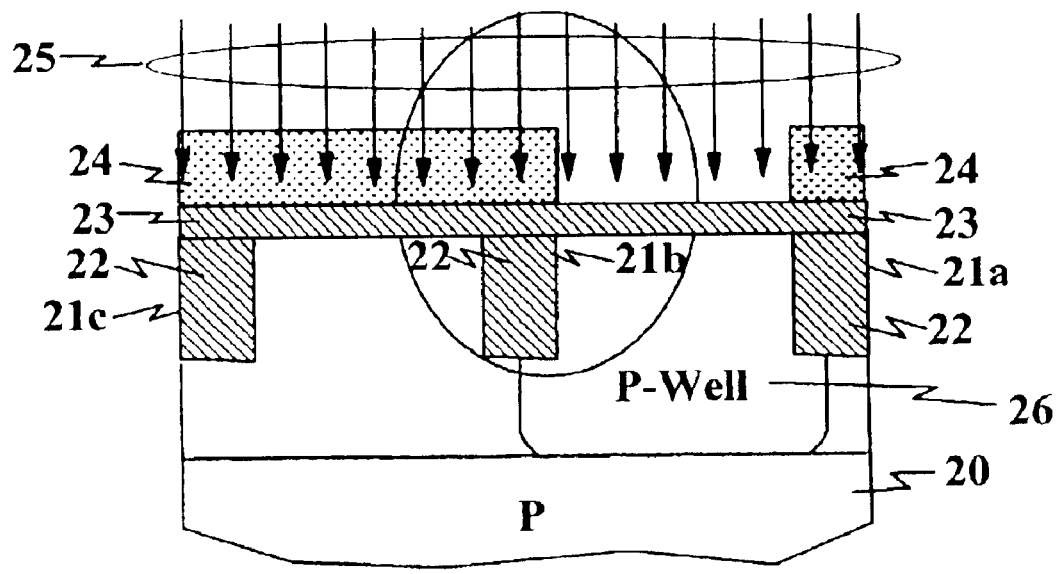
FIG. 4 is cross-sectional view of the prior art semiconductor wafer of the FIG. 1 with all of the wafer having a thin, easily removed, impurity capturing layer of the present invention and with part of the wafer masked with a photoresist during deep implantation of impurities to form a P-well.
Figure 5:
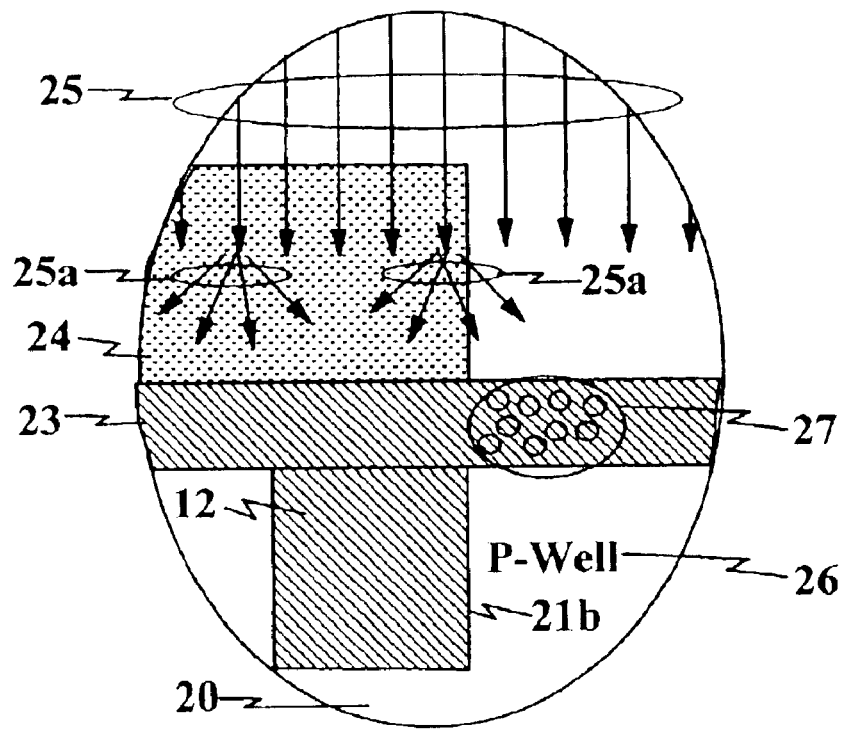
FIG. 5 is an enlarged cross sectional view of part of the semiconductor wafer of the FIG. 4 showing scattered impurities ions in the layer of the present invention adjacent the masked part of the wafer.

Turning now to FIGS. 4 and 5 and a description of the present invention, a silicon wafer 20, with shallow trench isolation (STI) trenches 21a, 21b and 21c filled with an insulating material such a silicon oxide 22, is coated with a thin, easily removed, scattered impurity collecting layer 23. The layer 23 preferably is an anti-reflective coating (ARC), such as a spin-on glass or polymer, which is well known in the art. Normally, the thickness of the layer 23 will be greater than 30 nm but less than 1000 nm. The thickness of the layer 23 is determined by the material of the layer, the particular impurity and depth the impurity is implanted. In general, the layer 23 thickness is about one-third ($\frac{1}{3}$) to about one-fiftieth ($\frac{1}{50}$) of the depth of the desired implant. With the thickness of layer 23 being greater than about 30 nm but less than 1000 nm, boron, boron fluorides, or indium is deep implanted with energies greater than 8 keV and typically within the range of 30 keV and 1200 keV. The dosage of boron for the deep implant can range from 1e13 to 1e16 $cm^{-2}$. If the ARC is deposited at a thickness of less than 30 nm, then the boron energies can be as low as 5 keV for the deep implant. The energy of the scattered impurity ions range from about one-third ($\frac{1}{3}$) to about one-hundredth ($\frac{1}{100}$) of the original energy of the implanted impurities. Although FIGS. 4 and 5 show the implantation of a P-well, the present invention can be used for the deep implant of a N-well with either phosphorus or arsenic or both. Again with the thickness of the ARC at greater than 30 nm but less than 1000 nm, phosphorus is deep implanted with energies of greater than 12 keV and typically within the range of 40 keV and 1200 keV. The dosage of phosphorus for the deep implant can range from 5e12 to 1e16 $cm^{-2}$. Again, if ARC is deposited at a thickness of less than 30 nm, then the phosphorus energies can be as low as 2 keV for the deep implant. Although the detailed description of the present invention has centered around forming wells for a CMOS transistor, the present invention also can be used in the forming of lightly doped drains (LDD) and heavily doped drains (HDD). In these applications, the dosage for boron and phosphorus will be greater than 5e14 $cm^{-2}$.

Figure 3:
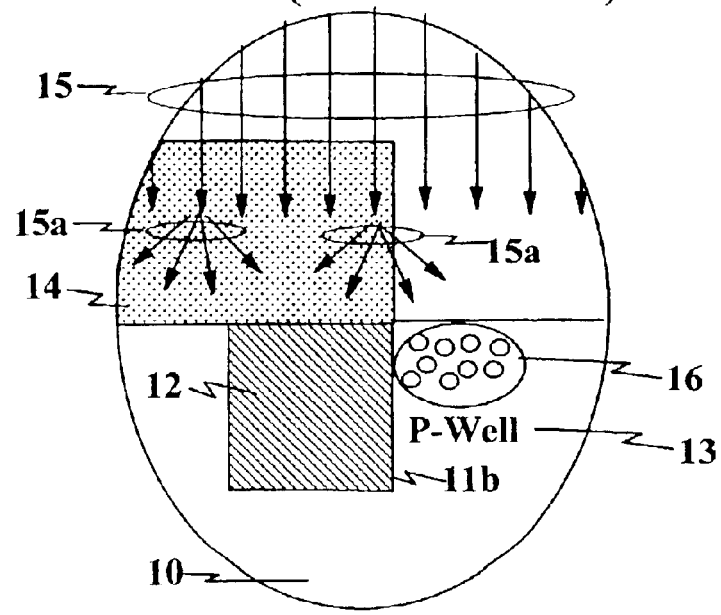
FIG. 3 is an enlarged cross sectional view of part of the prior art semiconductor wafer of the FIG. 2 showing scattered impurities ions in the wafer substrate adjacent the masked part of the wafer.

On top of the layer 23 is deposited a photoresist 24, such as the type used in describing the prior art method for deep implant in FIGS. 2 and 3. Again, it masks the area between benches 21b and 21c and the trenches 21a, 21b and 21c. Boron ions, as shown by the arrows 25 are implanted into the wafer 20 in an area not masked by the photoresist to form a P-well 26. In the photoresist masked area, the boron ions are blocked by the photoresist 24, except for those scattered ions, as shown by the arrows 25a, some of which are deflected into the area not masked and as shown as holes 27 in FIG. 5. However, unlike the prior art method of FIGS. 2 and 3, the scattered boron ions, as shown in FIG. 5 by arrows 25a or as holes 27, are captured in the layer 23 and are prevented from reaching the wafer substrate 20, thereby preserving the performance of the fabricated CMOS transistors in the integrated circuit chips of wafer 20. After forming the P-well, the photoresist 24 is removed and reapplied to mask the P-well 26 during the formation of the N-well. The layer 23 preferably remains on the wafer 20 until all of the deep implants are completed.

The layer 23 has been shown to underlie the photoresist 24 in FIGS. 4 and 5, but it is not necessary for it to be present under the photoresist. Layer 23 only needs to cover the area between trenches 21a and 21b. However, limiting the layer 23 to only that area would entail additional steps and, for simplification of the method of the present invention, layer 23 is deposited across the entire wafer. In addition, ARC has been described as the preferred material for the layer 23, a hardmask comprising a silicate glass, such as borosilicate glass/tetraethyloxysilicate (BSG/TEOS) can be substituted for the ARC. Instead of spin coating as is the deposition method for ARC, the BSG/TEOS is chemically vapor deposited (CVD). Although not required, a thin silicon oxide layer (not shown) may be present under the impurity ion capturing layer 23, such as the ARC layer and the hardmask layer.

Figure 6:
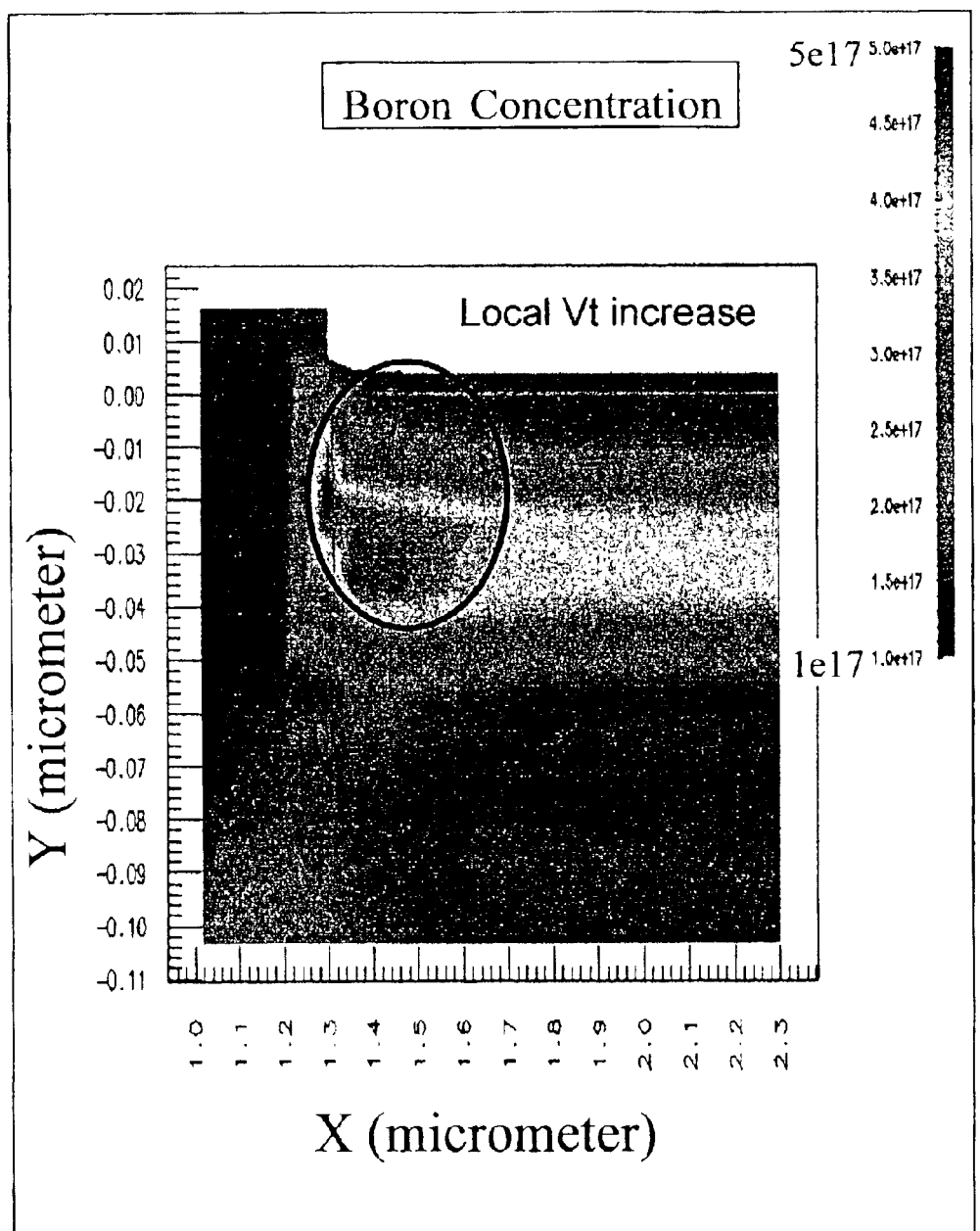
FIG. 6 is a picture from the result of Monte Carlo simulation of scattered implanted boron ions without a scattered ion capturing layer.
Figure 7:
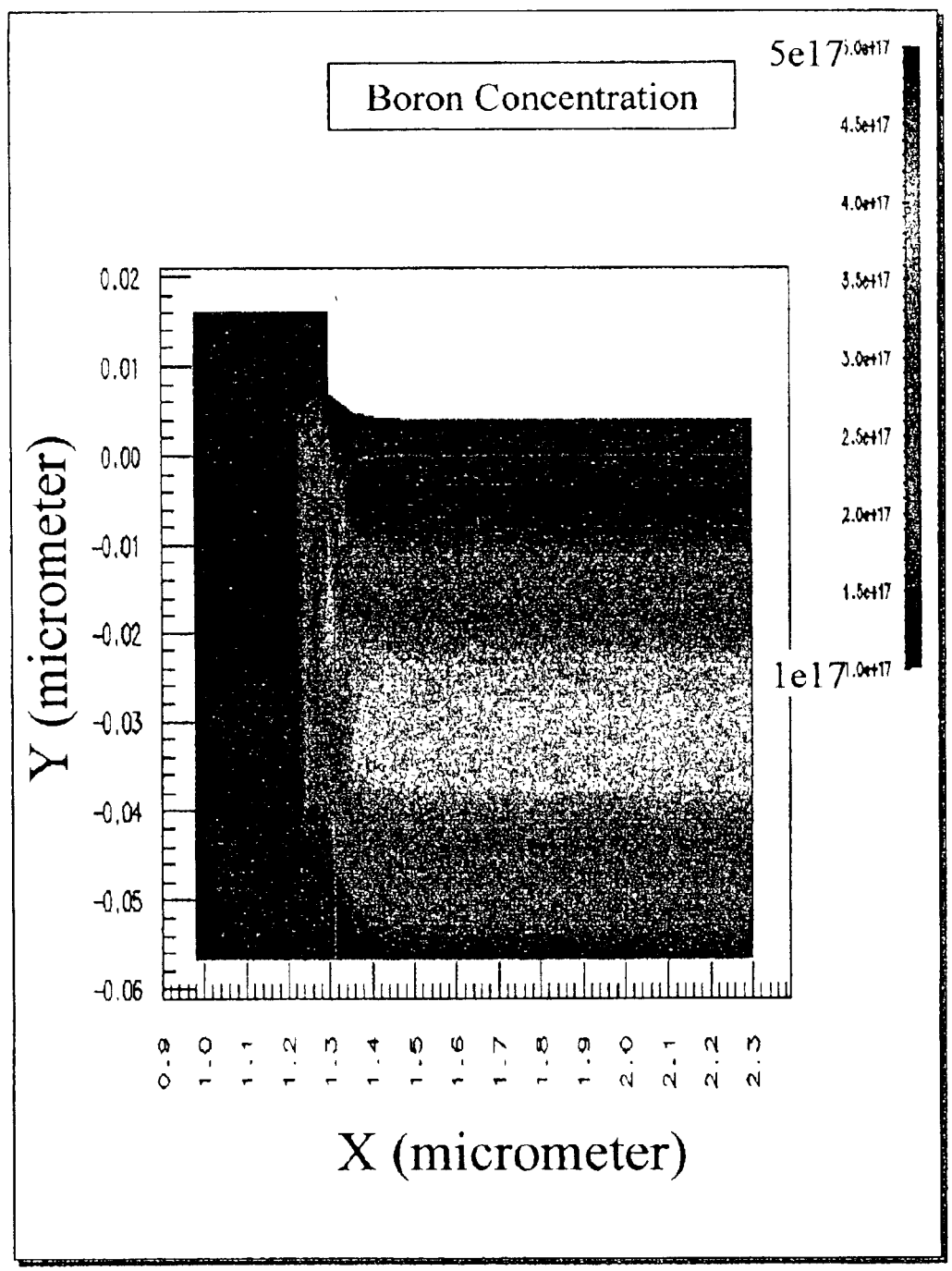
FIG. 7 is a picture from the result of Monte Carlo simulation of scattered implanted boron ions with a scattered ion capturing layer.

As evidence of impurity ion scattering out of the photoresist, FIGS. 6 and 7 shows two pictures of a simulation comparison of Monte Carlo ion implantations without (FIG. 6) and with (FIG. 7) the impurity ion capturing layer 23 (FIGS. 4–5) of the present invention. The two pictures compare the chemical concentration of the implanted boron impurity inside the silicon wafer. The depth and width of the silicon in the pictures are measured in $\mu$ms and the bars on the left hand sides of both pictures are a measure of concentration of the boron ions. In the FIG. 6, without the layer 23 (FIGS. 4–5), the increased concentration of boron ions as shown by the circle near the resist edge above the shallow trench isolation, as shown by STI, is clearly visible due to scattered boron impurity ions. It can be seen that this increased concentration of boron ions extends about 1.5 $\mu$m away from the resist edge. In FIG. 7, with a 180 nm hardmask layer of the present invention, the increased concentration boron ions is not shown to be present in the silicon wafer. The advantage of not having an increase concentration of ions near the resist edge is that a narrow field effect transistor (FET), which is the design for increased density of integrated circuits now and in the future, will have almost constant threshold regardless of whether it is located near the resist edge. The benefit is an increased yield of integrated circuit chips from the fabricated wafers.

Although this invention has been described relative to particular embodiments, it will be apparent to those skilled in the art that various changes and modification may be made without departing from the spirit and scope of the inventions defined in the following claims

What is claimed is:

1. A method of fabricating an integrated circuit requiring a deep ion implantion in a semiconductor substrate comprising the steps of:

providing a semiconductor substrate having an upper surface through which impurity ions are to be implanted;

applying a thin, easily removed, scattered impurity ion capturing layer on said surface of the semiconductor substrate;

applying a mask material adjacent said ion capturing layer to provide a mask with openings for passing implanted ions into the substrate, wherein the mask openings expose the ion capturing layer, the ion capturing layer extending across the entirety of each of the mask openings;

implanting impurity ions of sufficient energy and dosage to implant the ions deep in the semiconductor substrate; and capturing by the ion capturing layer those ions directed into the mask material but scattered in the material and deflected at the edge of the mask opening into the opening.

2. The method of claim 1 wherein the ion capturing layer is an antireflective coating.

3. The method of claim 1 wherein the ion capturing layer is a hardmask layer.

4. The method of claim 1 wherein the ion capturing layer is used in conjunction with the formation of a deep implanted P-well or N-well.

5. The method of claim 1 wherein the thickness of the ion capturing layer is determined by the energy of the ions being implanted.

6. The method of claim 5 wherein the thickness of the scattered ion capturing layer is greater than 30 nm and less than 1000 nm.

7. The method of claim 1 wherein the impurity ions are boron ions and wherein the ion capturing layer is less than 30 nm in thickness and the energy of the boron ions is less than 5 keV.

8. The method of claim 1 wherein said ion capturing layer is only on the surface of the semiconductor substrate in the mask openings.

9. The method of claim 1 wherein the ion capturing layer is used during all deep implantations in the fabrication of the integrated circuit.

10. A method of fabricating an integrated circuit requiring a deep ion implantation in a semiconductor substrate comprising the steps of:

providing a semiconductor substrate having an upper surface through which impurity ions are to be implanted;

applying a thin, easily removed, scattered impurity ion capturing layer on said surface of the semiconductor substrate;

applying a mask material adjacent said ion capturing layer to provide a mask with openings for passing implanted ions into the substrate;

implanting impurity ions of sufficient energy and dosage to implant the ions deep in the semiconductor substrate; and capturing by the ion capturing layer those ions directed into the mask material but scattered in the material and deflected at the edge of the mask openings into the opening, wherein, after implantation is completed, the ion capturing layer is removed.

11. In a method of fabricating an integrated circuit with shallow trench isolation requiring a plurality of deep ion implantation in a semiconductor substrate for various structures of the integrated circuit comprising the steps of:

providing a semiconductor substrate having an upper surface through which impurity ions are to be implanted;

applying a thin, scattered impurity ion capturing layer on said surface of the semiconductor substrate;

applying a mask material adjacent said ion capturing layer to provide a mask with openings for passing implanted ions into the substrate;

implanting impurity ions of sufficient energy and dosage to implant the ions deep in the semiconductor substrate;

capturing by the ion capturing layer those ions directed into the mask material but scattered in the material and deflected at the edge of the mask opening into the opening;

removing the mask material after implantation and applying another mask material with openings for the next implantation of another structure; and removing the ion capturing layer after all of the deep implantation for the various structures have been made.

12. The method of claim 11 wherein the thickness of the ion capturing layer is determined by the energy of the ions being implanted.

13. The method of claim 12 wherein the ion capturing layer thickness is about one-third ($1/3$) to about one-fiftieth ($1/50$) of the depth of the desired implant.

14. The method of claim 11 wherein the energy of the scattered impurity ions range from about one-third ($1/3$) to about one-hundredth ($1/100$) of the original energy of the implanted impurity ions.

15. The method of claim 11 wherein the scattered ion collecting layer is an anti-reflecting coating.

16. The method of claim 11 wherein the scattered ion collecting layer is a hardmask layer.

17. The method of claim 16 wherein the thickness of the hardmask is 180 nm and the implanted ion is boron.

18. The method of claim 11 the integrated circuit being fabricated will include a narrow transistor adjacent the trench isolation.

19. The method of claim 18 wherein, during fabrication of the narrow transistor, the ion capturing layer captures scattered ions which would affect the performance of the narrow transistor.

20. The method of claim 11 wherein the thickness of the scattered ion capturing layer is within the range of from 30 nm to 1000 nm.

21. The method of claim 11 wherein in the step of applying a mask material, the mask openings expose the ion capturing layer, the ion capturing layer extending across the entirety of each of the mask openings.

\* \* \* \* \*